(12) United States Patent
Lin et al.

(10) Patent No.: US 12,009,445 B2
(45) Date of Patent: Jun. 11, 2024

(54) METHOD OF PATTERNING A THIN-FILM PHOTOVOLTAIC LAYER STACK

(71) Applicant: NICE SOLAR ENERGY GMBH, Schwäbisch Hall (DE)

(72) Inventors: Shuping Lin, Schwaebisch Hall (DE); Raffael Reineker, Kuenzelsau (DE); Hongqing Shan, Cupertino, CA (US); Joachim Leopold Ludwig Müller, Fellbach (DE); Bernd Sprecher, Schwaebisch Hall (DE); Kay Ogassa, Leinfelden-Echterdingen (DE)

( * ) Notice: Subject to any disclaimer, the term of this patent is extended or adjusted under 35 U.S.C. 154(b) by 0 days.

(21) Appl. No.: 17/800,617

(22) PCT Filed: Feb. 17, 2021

(86) PCT No.: PCT/EP2021/053823
§ 371 (c)(1),
(2) Date: Aug. 18, 2022

(87) PCT Pub. No.: WO2021/165286
PCT Pub. Date: Aug. 26, 2021

(65) Prior Publication Data
US 2023/0080774 A1  Mar. 16, 2023

(30) Foreign Application Priority Data
Feb. 20, 2020 (EP) .................................. 20158477

(51) Int. Cl.
*H01L 31/0463* (2014.01)
*H01L 31/0224* (2006.01)
*H01L 31/032* (2006.01)

(52) U.S. Cl.
CPC .. *H01L 31/0463* (2014.12); *H01L 31/022425* (2013.01); *H01L 31/0322* (2013.01)

(58) Field of Classification Search
CPC . H01L 21/00; H01L 21/02; H01L 31/022425; H01L 31/0322; H01L 31/0463; H01L 31/18; H01L 31/186
See application file for complete search history.

(56) References Cited

U.S. PATENT DOCUMENTS

| | | | | |
|---|---|---|---|---|
| 4,729,970 A | * | 3/1988 | Nath | ..................... H01L 31/208 136/258 |
| 5,320,723 A | * | 6/1994 | Kawakami | ............ H01L 31/186 324/501 |

(Continued)

FOREIGN PATENT DOCUMENTS

WO  2013149751 A1  10/2013

OTHER PUBLICATIONS

European Patent Office, International Search Report and Written Opinion of the International Searching Authority, dated Aug. 23, 2022 (dated Aug. 23, 2022), pp. 1-7, European Patent Office (EPO) ISA, Berlin, Germany (DE).

(Continued)

*Primary Examiner* — Mayla Gonzalez Ramos
(74) *Attorney, Agent, or Firm* — CHRISTOPHER C. DREMANN, P.C.; Christopher C. Dremann (57) ABSTRACT

A method of patterning a thin-film photovoltaic layer stack includes the steps of providing a continuous layer stack comprising a planar substrate, a first electrode layer on the substrate and a photovoltaic layer on the first electrode layer, immersing the layer stack into an electrically conductive solution, applying a bias voltage between the electrolyte solution and the first electrode layer and converting a first material or a first material composition provided in at least a first portion of the layer stack into a first reaction product by an electrochemical reaction, wherein the first reaction product has an electrical conductivity that is lower than an electrical conductivity of the first material or first material (Continued)

composition, or removing a first material or a first material composition provided in at least a first portion of the layer stack by an electrochemical reaction.

23 Claims, 6 Drawing Sheets

(56) References Cited

U.S. PATENT DOCUMENTS

| | | | |
|---|---|---|---|
| 5,798,284 A | 8/1998 | Nakagawa | |
| 7,691,241 B2 * | 4/2010 | Murakami | B23H 3/04 |
| | | | 204/224 R |
| 2015/0068578 A1 * | 3/2015 | Probst | H01L 31/0322 |
| | | | 136/244 |
| 2019/0296162 A1 | 9/2019 | Grand et al. | |

OTHER PUBLICATIONS

European Patent Office, Communication under Rule 71(3) EPC—Intention to grant: Claims 1-14, dated Jul. 25, 2023 (dated Jul. 25, 2023), pp. 1, 31-33, European Patent Office (EPO) Berlin, Germany (DE).

European Patent Office, Communication under Rule 62 EPC—Extended European search report issued in divisional application EP 23 217 965.5, Apr. 16, 2024 (Apr. 16, 2024), pp. 1-6, European Patent Office (EPO) Munich, Germany (DE).

* cited by examiner

METHOD OF PATTERNING A THIN-FILM PHOTOVOLTAIC LAYER STACK

FIELD OF THE INVENTION

The present invention relates to a method of patterning a thin-film photovoltaic layer stack. In one aspect the method relates to the production of a photovoltaic thin-film solar module produced by the method of patterning the photovoltaic layer stack. In another aspect the present invention relates to a photovoltaic layer stack, in particular to a photovoltaic solar module.

BACKGROUND OF THE INVENTION

A photovoltaic layer stack is for instance known from document WO2013/149751 A1. There, a back electrode layer is applied on a substrate and at least a conductive barrier layer, at least one contact layer, at least one kesterite or chalcopyrite semiconductor absorber layer and at least a buffer layer are applied on a substrate. Then, the applied layers are removed by means of laser treatment with the formation of first separating trenches. Thereafter, the separating trenches are filled with at least one insulating material. Then, those layers which extend from the barrier layer in the direction of a semiconductor absorber layer are removed with the formation of second separating trenches.

Known processes for manufacturing such photovoltaic thin-film solar module typically come along with two main limitations that are detrimental for a mass production of solar cells. One limitation is that during the scribing of a first trench a high quality laser has to be used. Otherwise, the edge of the semiconductor photovoltaic active layer could be damaged, thus leading to the increase of a risk of a shunt between bottom and top electrodes of the solar cells on the solar module. A further limitation is that filling of the first trench with an insulating material is quite challenging. The quality of the filling is difficult to control especially when there is a comparatively large tripping during the trench scribing process. Moreover, the durability of the filling material as well as the contact resistivity of printed conductive materials in or on the layer stack may require further improvement.

In a conventional monolithic interconnected thin-film solar module the first trench is filled with absorber material. Therefore, the shunt resistance of this trench is limited by the width of the first trench. Moreover, the first trench is scribed before the photovoltaic active layer is applied, hence before the absorber layer is deposited on the substrate. The deposition of the photovoltaic active layer or absorber layer on the substrate requires application of comparatively high temperature, which may result in a heat-induced mechanical deformation of the substrate. As a consequence, the first trench or scribe lines may become subject to a bending. This makes the subsequent scribing or manufacturing of further second and third trenches even more difficult. At least controlling of the spacing between the individual scribe lines or trenches is quite challenging.

Also, when scribing a line or introducing a trench in the layer stack by making use of a laser beam the laser always heats up the peripheral area or edge of the layer stack extending along the scribe line or trench. Such peripheral edges of the photovoltaic active layer may be damaged or may be subject to a chemical decomposition. After the deposition of the top electrode layer the damaged or chemically altered region of the photovoltaic active layer may exhibit a decrease in electrical resistance and may become a shunt path after the deposition of the top or front electrode. This may lead to a comparatively strong shunt in or along the respective trench.

The limited size of the trench makes it particularly difficult to fill the respective scribe line or trench with insulation material. Any filling defects may result in shunting points. The mechanical or chemical stability and hence the integrity of the insulation material over time may be also problematic, especially when the material is exposed to UV light in the sunshine.

It is therefore an aim of the present invention to provide an improved method of patterning of a thin-film photovoltaic layer structure and to provide an improved method of producing a thin-film solar module overcoming the disadvantages as described above and providing and supporting mass manufacturing of patterned photovoltaic layers and photovoltaic layer stacks at low or moderate costs with high precision. It is another aim to provide respective patterns of thin-film photovoltaic layer stacks and hence respective photovoltaic thin-film solar modules comprising such patterned layer stacks.

SUMMARY OF THE INVENTION

According to a first aspect of the present invention a method of patterning a thin-film photovoltaic layer stack is provided. The method is particularly dedicated to the patterning of a thin-film photovoltaic layer stack, e.g. for manufacturing a thin-film solar module. In particular, the method is dedicated to the production of a thin-film solar module. The method comprises numerous steps, namely of providing of a continuous layer stack. The layer stack comprises a substrate, a first electrode layer on the substrate and a photovoltaic layer on the electrode layer.

Generally, the substrate may be a planar substrate. The substrate may be also a flexible substrate. With some examples, the substrate comprises a plastic foil or thin glass. Typically, the substrate is an electrically insulating substrate. The first electrode layer may be either directly or indirectly arranged on the substrate. The first electrode layer may be considered as or may constitute a bottom electrode layer. The photovoltaic layer may be considered or may constitute a photovoltaic active layer. Hence, the photovoltaic layer is configured to generate a voltage in response to the elimination with electromagnetic radiation, e.g. in the visible spectral range.

In a further step the layer stack is immersed into an electrically conductive solution. With some examples, the electrically conductive solution is an electrolyte solution.

Hence, in the following, the term bottom electrode layer may be used as a synonym for the first electrode layer and vice versa. The term photovoltaic layer may be used as a synonym for a photovoltaic active layer and vice versa. The term solution may be used as a synonym for an electrically conductive solution, which may comprise an electrolyte solution or may consist of an electrolyte solution.

Also, a bias voltage is applied between the electrically conductive solution and the first electrode layer. Typically, and in order to apply a bias voltage to the solution a first electrode may be immersed into the solution or may be brought in contact with the solution. A second electrode for conducting of an electrochemical conversion process may be provided by the first electrode layer of the layer stack.

A first material or a first material composition provided in at least a first portion of the layer stack is converted into a first reaction product by an electrochemical reaction. This conversion typically takes place while the layer stack is in contact with the electrically conductive solution. Typically, the conversion takes place while the layer stack is immersed or submerged in the electrically conductive solution. The first reaction product has an electrical conductivity that is lower than an electrical conductivity of the first material or first material composition.

Alternative or additionally, a first material or a first material composition provided in at least a first portion of the layer stack is removed by an electrochemical reaction.

With some examples, there may be even a combination of conversion and removal of the first material or first material composition. Hence, converting of the first material or first material composition into a first reaction product may take place concurrently or sequentially with a removing of the material composition from the layer stack by the electrochemical reaction.

Generally, removal of material from the layer stack may not be limited to the first material or first material composition provided in at least a first portion of the layer stack but may also apply to a removal of the first material composition obtained by a conversion of the first material or first material composition by the electrochemical reaction while the layer stack is immersed in the electrically conductive solution.

Hence, in a first step the first material or first material composition can be converted into a first reaction product by a first electrochemical reaction. In a second step, the first reaction product can be removed from the layer stack or it can be further converted into a second reaction product by a chemical reaction. The second chemical reaction may be a second electrochemical reaction. The first and second chemical reactions or electrochemical reactions may take place while the layer stack is immersed or is in contact with a first electrically conductive solution and a second solution, respectively. Typically, the second chemical reaction may take place in a second solution that distinguishes from the first solution.

With some examples, the first and second chemical reactions, e.g. electrochemical reactions may take place in one and the same electrically conductive solution, which is e.g. an electrolyte solution.

With some examples, the first portion, e.g. a well-defined selected portion of the layer stack, may be entirely or partially converted or removed from the layer stack by the electrochemical reaction. Typically, at least a first portion of the layer stack comprising the first material or first material composition is converted or transformed into a first reaction product by the electrochemical reaction, e.g. in particular by a selective electrolysis taking place at or in the first portion of the layer stack. The first reaction product obtained through the electrochemical reaction with the electrically conductive solution has an electrical conductivity that is lower than an electrical conductivity of the first material or first material composition.

Insofar, the method provides an approach to selectively convert or to selectively transform a first material and/or first material composition and/or a selected portion of the layer stack having an intrinsic electrical conductivity, into a reaction product having an electrical conductivity that is lower than the electrical conductivity of the first material or first material composition.

The electrolytic based conversion or transformation of at least a first material, first material composition and/or first portion of the layer stack into a reaction product has the benefit that the reaction product may either entirely or at least partially remain on or inside the layer stack. It does not necessarily have to be removed in order to provide electric insulation, e.g. between individual solar cells of the layer stack or thin-film solar module.

The first material, the first material composition and/or the first portion of the layer stack, which may be electrically conductive before the electrochemical reaction takes place, may be located in or on the layer stack. The first material or first material composition or the first portion may entirely or at least partially convert or transform into the first reaction product. In this way, the first portion, and/or the first material or first material composition entirely filling the first portion of the layer stack may be electrically passivated.

With some examples, the first portion, which may be electrically conductive may be converted or transformed into a reaction product that is electrically insulating. In this way, removal of a first portion of a layer stack may be no longer necessary and filling of a gap in the layer stack with an insulating material may become substantially obsolete.

Rather, the first portion of the layer stack and hence the first material or first material composition making up the first portion is chemically or electrochemically modified and hence converted or transformed into a reaction product that is effectively electrically insulating.

In this way, a patterning of the photovoltaic layer stack can be obtained that is particularly suitable for mass manufacturing.

The conversion or transformation of at least a first portion of the layer stack may apply to different or selected portions of the layer stack. With some examples the first portion is a confined region of the electrically conducting first electrode layer of the layer stack. With other examples the first portion is an impurity embedded in the layer stack, particularly embedded in the photovoltaic layer. With further examples the first portion is a so-called pinhole in or on the layer stack.

With further examples the first portion is a side edge of the layer stack extending along a trench or scribe line. Due to the scribing process or laser ablation leading to the formation of the scribe line or trench the adjoining edge of the remaining layer stack extending along the respective scribe line or trench may be subject to a decomposition or chemical reaction leading to an increase of the electrical conductivity of the side edge.

By immersing the layer stack into the electrolyte solution and by applying a bias voltage across the electrically conductive solution and the first electrode layer and electrochemical reaction, e.g. an electrolytic conversion process, can be initiated and/or controlled thus leading to a desired passivation of the first portion in terms of electrical conductivity.

According to a further example the method comprises selectively removing the photovoltaic layer along a first line, e.g. along a first scribe line thereby forming a first trench or numerous first trenches in the photovoltaic layer. Removing the photovoltaic layer and formation of the first trenches may take place before or after immersing the layer stack into the solution. When the first trench is described or formed in the photovoltaic layer before the layer stack is immersed in the solution the underlying first layer may form a bottom of the first trench because it may not be removed during the step of removing of the photovoltaic layer.

Hence, during the scribing process by laser beam application the bottom electrode layer may remain on the substrate. When immersing the layer stack in the solution the first electrode layer may be directly exposed to the electrolyte solution only in the region of the first trench, i.e. in a region, where the photovoltaic layer, e.g. the semiconducting absorber layer has been removed. Then, only that portion of the first electrode layer in the region of the first trench may be selectively subject to the electrochemical reaction and to the conversion or transformation from a first material or first material composition into the first reaction product.

Residual parts of the bottom electrode layer located outside the first trench might be inherently protected by the photovoltaic layer or further layers located on top of the bottom electrode layer. Here, the remaining photovoltaic layer provides a protection and prevents a direct contact of the first electrode layer with the solution. In this way, only the portions of the first electrode layer that are uncovered by the scribing process of the first trench will become subject to the electrochemical reaction.

The immersion of the layer stack into the solution may also take place before the first scribe line or trench is scribed in the layer stack. Here, eventual impurities or defects of the layer stack may become subject to the electrochemical conversion or transformation process, thereby increasing the shunt resistance in the layer stack across such impurities.

According to a further example selected removal of the photovoltaic layer and formation of the first trench comprises applying a laser beam onto the layer stack along the first line. Typically, the laser beam is moved along the first line to form the first trench. The laser wavelength may be particularly adapted and configured for ablation of the photovoltaic layer. The laser wavelength and intensity as well as the beam shape of the laser beam may be particularly adapted to remove only the photovoltaic layer. The bottom electrode layer may remain substantially unaffected by the laser beam. In this way, scribing of the first trench line can be facilitated because the bottom electrode layer is allowed to remain on the substrate after or during the process of formation of the first trench. The laser wavelength, the laser intensity and the beam shape may be adapted to ablate or to remove the photovoltaic layer exclusively and to leave the entirety or at least a portion of the first electrode layer on the substrate.

Alternatively, and instead of using a laser beam the first trench can be also provided and/or formed by mechanical ablation, e.g. by moving a mechanical scribing tool along the first line. The mechanical scribing tool may be configured to scrape off at least a portion of the photovoltaic layer, thereby scribing the first trench along the first line.

Typically, formation of the first trench or scribing of the first line is conducted after the deposition of the photovoltaic layer on the layer stack. In this way, the first trench formation applies after the layer stack has been exposed to comparatively high temperatures during the deposition of the photovoltaic layer. Eventual thermal effect and associated geometric deformations of the substrate and/or of the layer stack do therefore not have any influence on the quality of the first trench.

According to a further example the first portion of the layer stack is a side edge of the photovoltaic layer extending along the first trench. Here, the first portion may be chemically decomposed during the laser scribing or laser ablation process. The photovoltaic material may be chemically altered due to the thermal energy deposition during the formation of the first trench. Now and by immersing the layer stack in the solution and by conducting the electrochemical reaction the first material, the first material composition and/or the first portion and hence those portions of the photovoltaic layer that have been chemically modified during the formation of the first trench are subject to the electrochemical reaction.

The electrochemical reaction with the solution increases the electrical resistivity and decreases the electrical conductivity of the first material, the first material composition and/or of the entirety of the first portion of the layer stack, in which the first material and/or the first material composition is or are located. Hence, the chemically decomposed or chemically altered material or material composition of the first portion, which typically may extend along the side edge of the first trench is converted or transformed into the reaction product exhibiting an increased electrical resistivity compared to the electrical resistivity of the first portion before the electrochemical reaction took place. In this way, the shunt resistance at the side edges of the first trench can be increased According to another example the first portion is an impurity in the photovoltaic layer. Such impurities may comprise tiny metal droplets or so-called flakes that are incorporated in the photovoltaic layer during layer deposition. Typically, such impurities are made of an electrically conducting material, e.g. a metal, such as copper. They may cause a shunt across the cell after deposition of a second electrode layer, also denoted as a top electrode layer. Such metal droplets or flakes may have their origin in a malfunction of the deposition equipment. By immersing the layer stack with impurities embedded therein in the solution and by executing the above-described electrochemical reaction, the electrical resistivity of such impurities can be increased, thereby reducing the likelihood of shunts otherwise caused by such impurities.

In another example an impurity in the photovoltaic layer may be also due to a so-called pinhole in the photovoltaic layer. Such pinholes might be overgrown by the buffer layer typically deposited on top of the photovoltaic layer. Pinholes, that might be due to dust particles on the bottom electrode layer may also lead to an electrical shunt between first and second electrode layers, hence between the bottom electrode layer and the top electrode layer. By immersing the layer stack including such holes into the electrically conductive solution and by conducting the electrochemical reaction within the solution the first electrode layer may be at least partially converted or transformed into the first reaction product.

Particularly in the region of the pinholes the first electrode layer is effectively uncovered or may be only covered by a comparatively thin layer of photovoltaic material. In this way, a part or portion of the first electrode layer located in direct vicinity or overlapping with a pinhole in the photovoltaic layer is effectively uncovered or is provided only with a comparatively thin cover, which is permeable for the electrically conductive solution to such an extent, that the electrochemical reaction with the electrolyte solution takes place in the bottom electrode layer in the region or in direct vicinity of a pinhole area of the layer stack.

According to a further example the first material or first material composition of the first portion of the layer stack comprises a metal. The first reaction product obtained through the electrochemical reaction with the electrolyte solution comprises at least one of a metal oxide, a metal selenide and a metal sulfide.

With some examples, converting the metal of the first electrode layer into a metal oxide effectively passivates the metal first electrode in terms of electrical conductivity. The metal oxide, the metal selenide and/or the metal sulfide exhibits an increased electrical resistivity compared to the metal. The metal oxide, the metal selenide or the metal sulfide may exhibit an electrical resistance that effectively classifies the respective oxide, selenide or sulfide as an electrical insulator. In this way a dedicated or selected metal portion provided in a region of the layer stack can be transformed or converted into at least one of a metal oxide, a metal selenide and a metal sulfide, thereby increasing the electrical resistivity of the metal portion of origin.

According to another example the first material or first material composition of the first portion of the layer stack comprises Molybdenum (Mo) or consists of a Mo. Then, the first reaction product comprises at least Molybdenum Oxide ($MoO_x$), with $2.5 < x \leq 3$. Here, the major portion of the first reaction product may comprise $MoO_3$. The reaction product may even substantially consist of $MoO_3$. With some examples the first reaction product comprises $MoO_3$ and/or substantially consists of $MoO_3$. The $MoO_3$ exhibits a particularly low degree of electrical conductivity and classifies the respective reaction product as an electrical insulator.

Additionally or alternatively the first reaction product comprises at least one or one of $ZnMoO_4$, $CaMoO_4$, and $CdMoO_4$. This particularly applies when the electrically conductive solution comprises at least one of Zn, Cd, and Ca.

According to another example the layer stack is immersed into a salt solution containing at least one of Zn, Cd, and Ca. Here, at least one of the first material, the first material composition and the first reaction product is transformed into one of $ZnMoO_4$, $CaMoO_4$, and $CdMoO_4$. Typically, this transformation applied at least to a surface of one of the first material, the first material composition and/or the first reaction product. Such a surface is typically in direct contact with the salt solution containing at least one of Zn, Cd, and Ca.

With some examples, the solution containing one of Zn, Cd, and Ca is the above-mentioned electrically conductive solution. With other examples the above-mentioned electrically conductive solution is a first solution and the solution containing one of Zn, Cd, and Ca is a second solution that distinguishes from the first solution.

Here, the method may comprise a step of immersing the layer stack into a first electrically conductive solution in order to convert at least a portion of the first material or first material composition into the first reaction product. The method may comprise a further and subsequent step of immersing the layer stack into a second solution containing one of Zn, Cd, and Ca. The layer stack, e.g. at least one of the first material, the first material composition and the first reaction product may then be further converted into one of $ZnMoO_4$, $CaMoO_4$, and $CdMoO_4$.

With some examples, Molybdenum and the first material may be converted into $MoO_3$. In order to mechanically stabilize and/or to prevent dissolving or removal of $MoO_3$ from the layer stack by submerging the latest or into the second solution the $MoO_3$ layer surface can be converted into insoluble Molybdate, thereby preventing the respective layer from dissolving. In such a further oxidation process, the pH value of the solution should be controlled to prevent Cd or Zn ions from deposition as hydroxides.

Generally, for conducting an electrochemical process or a chemical reaction with any of the solutions described herein it will be sufficient to bring the layer stack in direct contact with the respective solution. Even though it is intended for many practical implementations to immerse or to submerge the layer stack into the respective solution it is generally sufficient to bring the layer stack in mechanical contact with the solution, e.g. by arranging the layer stack in a floating configuration with a surface of the solution.

With some examples, the first electrode layer is electrically connected to the anode of a bias voltage supply or electric power supply. A further electrode, i.e. a cathode connected to the bias voltage supply is brought in electrical contact with the electrically conductive solution. With some solutions the first electrode layer is selectively oxidized, in particular in the area of the first trench. At least a portion of the first electrode layer may dissolve in the solution. Moreover, the electrochemical reaction may not only take place in that particular region of the first electrode layer forming the bottom of the trench. The conversion or transformation of the first electrode layer may also extend into areas below the adjoining photovoltaic layer. This may even increase the shunt resistance of the photovoltaic cell.

In case of a metal oxidation of at least a portion of the first electrode layer the respective portion of the first electrode layer is transformed or converted into an electrically insulated material. Moreover, when the material of the first electrode layer comprises or consists of Molybdenum as the first material it is of particular benefit, when the reaction product comprises a substantial fraction of Molybdenum Oxide $MoO_3$.

So with some examples, the first reaction product may comprise at least 30%, at least 40%, at least 50%, at least 60%, at least 75% or at least 80% of $MoO_3$ after termination of the electrochemical reaction with the electrically conductive solution.

During the electrochemical reaction, which is an anodic oxidation process, the Mo electrode may be oxidized to $Mo_2O_5$ very quickly, and may then further oxidize to $MoO_3$. In a basic electrolyte solution the electrochemical reactions on the electrode/solution interface can be described as follows:

Anodic reactions:

$$2Mo + 10OH^- \rightarrow Mo_2O_5 + 5H_2O + 10e$$

$$Mo_2O_5 + 2OH^- \rightarrow 2MoO_3 + H_2O + 2e$$

$$MoO_3 + 2OH^- \rightarrow MoO_4^{2-} + H_2O$$

Cathodic reaction:

$$2H_2O + 2e \rightarrow H_2\uparrow + 2OH^-$$

The overall reaction:

$$Mo + 2H_2O + 2OH^- \rightarrow MoO_4^{2-} + 3H_2\uparrow$$

As seen in anodic reactions, the oxidation of Mo consumes a lot of $OH^-$ ions, therefore seriously decreases the solution pH in the anodic oxidation area. At first, Mo is basically oxidized to $Mo_2O_5$ which is still conductive. Then, $Mo_2O_5$ is further oxidized to $MoO_x$ with $2.5 < x \leq 3$. The conductivity of the oxide becomes lower as the oxygen content increases. In the interface of $MoO_x$ and the solution, the Mo oxide is finally oxidized to $MoO_3$ which is dielectric and dissolvable, the thickness of it is the key parameter for the oxidation and insulation quality. As $MoO_3$ in the interface is dissolved, the Mo oxide beneath is further oxidized. By controlling of the solution concentration, its pH value, applied potential and reaction time, the oxidation rate and $MoO_3$ thickness can be regulated and controlled.

$MoO_3$ is dissolvable in water. The higher of solution pH, the higher of the dissolution rate. Basic electrolyte solution will accelerate the anodic oxidation process. However, the thin $MoO_3$ layer could also be dissolved before and during the rinsing of the whole module. To conquer this disadvantage of basic electrolyte, some other strategies could be employed to reduce the dissolution of $MoO_3$.

According to another example the first portion of the layer stack is a portion of the first electrode layer. In particular, the first portion is a portion of the first bottom electrode layer uncovered by the first trench scribed in or through the photovoltaic layer, e.g. by a laser beam. The first portion may extend over the entire thickness of the first electrode layer. The first portion may comprise a thickness that is equivalent or identical to the thickness of the first electrode layer. The first portion may comprise a width perpendicular to the elongation of the first trench that is equivalent or identical to the respective width of the trench. With some examples, the width of the first portion of the first electrode layer to be converted into the first reaction product is even somewhat larger than the respective width of the first trench. The width of the first portion of the first electrode layer and hence the width of the portion of the first electrode layer converted or to be converted into the first reaction product can be controlled by adjusting the voltage and by controlling the duration for which the layer stack is exposed to the bias voltage in the electrolyte solution.

According to another example the first material or first material composition of the first portion of the layer stack comprises a CIGS semiconductor material with a composition of $Cu_x(In,Ga)_ySe_z$, with $x+3y>2z$ and wherein the first reaction product comprises a CIGS semiconductor material with a composition of $Cu_x(In,Ga)_ySe_zO_w$, with $x+3y\leq2(w+z)$ and $w>0$.

This conversion or transformation of semiconductor material into the reaction product particularly applies for regions of the layer stack extended along an adjacent trench or scribe line. When a laser beam is used for producing the first trench in the layer stack the material in the middle of the scribe line or in the center of the laser beam is effectively removed. However, due to a non-homogeneous transverse beam profile towards the borders of the scribe line and hence towards the outer edges of the laser beam, the laser power density decreases. In this area of decreased laser power density, the thermal energy deposited in the layer stack may be insufficient to completely ablate the semiconductor material in this region. In practice, some parts of the layer remain but is subject to a chemical modification or decomposition due to thermal energy deposition.

In particular, the stoichiometric composition of the material may slightly change, thus leading to respective modifications of the electrical conductivity of the edge or border region. Some of the first portion of the layer stack extending along the first trench or scribe line melts. Typically, undamaged or non-altered semiconductor material or photovoltaic active material comprising CIGS (copper, indium, gallium, selenide) has a composition of $Cu_x(In,Ga)_ySe_z$ with $x+3y\leq2z$. During the laser ablation process, the material may lose a small amount of selenium, e.g. up to 15% or even more. The composition of the altered semiconductor material is found to have a composition of $x+3y>2z$.

In other cases, losses of selenium of 1 to 50% have occurred. Insofar, the semiconductor material becomes selenium deficient and loses at least partially its semiconducting properties. It tends to behave like a conducting metal and may shunt the bottom electrode layer with the top or front contact layer that is deposited afterwards.

By means of the electrochemical reaction with the electrically conductive solution, hence by conducting a respective anodic oxidation process oxygen can be incorporated into the semiconductor material. The resulting reaction product is enriched with oxygen or selenium. Typically, the reaction product comprises a CIGS semiconductor material with a composition of $Cu_x(In,Ga)_ySe_zO_w$, with $x+3y\leq2(w+z)$ and $w>0$. this material has a lower electrical conductivity compared to the damaged semiconductor material with $x+3y>2z$.

In this way, the previously decomposed or damaged semiconductor material can be transformed into a reaction product exhibiting a lower electrical conductivity than the previously damaged or laser-modified material. In this way, the undesired effects of a locally increased electrical conductivity can be at least partially reversed. Moreover, the converted material may still cover the edges of the first trench.

Moreover, with the immersion of the layer stack in the electrically conductive solution also at least a portion of the chemically modified first material or first material composition, e.g. the first reaction product can be dissolved in the electrolyte solution. Hence, the first portion of the photovoltaic active material, e.g. a portion of the CIGS semiconductor material chemically modified due to deposition of thermal energy can be oxidized by way of the electrochemical reaction. The resulting reaction product may be also at least partially dissolved in the electrolyte solution.

According to another example the electrically conductive solution, e.g. the electrolyte solution, comprises at least one of $NH_3 \cdot H_2O$ and $(NH_4)_2SO_4$ or mixtures thereof. These electrolyte solutions provide for example the above described anodic oxidation process of a metal, e.g. Molybdenum of the layer stack.

With some further examples, the electrically conductive solution may comprise at least one of $K^+$ and $Na^+$ ions.

According to a further example the electrochemical reaction induced by the electrolytic solution and the application of the bias voltage can be divided into two even more steps. In a first step, the first material and/or the first material composition of the first portion is converted or transformed into the first reaction product. In a subsequent second step, the first reaction product may be further converted or transformed into a second reaction product. Moreover, also the second reaction product may be subject to a further conversion or transformation into a third or even forth reaction product.

With typical examples and with Molybdenum as the first material of the first portion a first reaction product may be $Mo_2O_5$. During the second process step the first reaction product $Mo_2O_5$ is further converted and/or transformed into a second reaction product, e.g. $MoO_x$ with $2.5<x\leq3$. This second reaction product further decreases the electrical conductivity of the first portion or of the first material. Preferably, the second reaction product has a second electrical conductivity that is lower than the electrical conductivity of the first reaction product. Hence, with a multistep electrochemical reaction, the electrical conductivity of the first portion and hence of the first material and/or first material composition of the first portion of the layer stack can be further reduced, thus leading to a higher shunt resistivity of the entire layer stack.

Moreover and with further examples, the second reaction product may comprise an increased mechanical stability compared to the first reaction product when immersed in the solution. Hence, the second reaction product may exhibit a mechanical stability that is higher than a mechanical stability of the first reaction product, particularly in terms of solubility in the solution. In other words, the solubility of the second reaction product may be lower than the solubility of the first reaction product in the electrically conductive solution.

According to a further example immersing the layer stack in the electrolyte solution includes immersing the layer stack in a basic electrolyte solution and thereafter immersing the layer stack in a neutral pH solution or in an acidic solution. Here, during the first process step the layer stack is immersed in the basic electrolyte solution and during or for the subsequent second process step the layer stack is immersed in the neutral pH electrolyte solution or acidic electrolyte solution.

Typically, during the first process step and with the basic electrolyte solution the first material or first material composition of the first portion of the layer stack may rather quickly convert into the first reaction product or into an intermediate reaction product, e.g. $Mo_2O_5$. Then and thereafter the layer stack is immersed in the neutral pH electrolyte solution or acidic electrolyte solution. This leads to a further conversion or a transformation of the first reaction product towards and into the second or final reaction product. In particular, the first reaction product can be further oxidized to $MoO_x$, with $2.5<z\leq3$ exhibiting an electrical conductivity that is lower than the electrical conductivity of $Mo_2O_5$.

Moreover and according to further examples the electrolyte solution may also comprise organic solvents with or without appropriate small amount of water and/or ionic components. One example for an organic aprotic solvent is Dimethyl sulfoxide (DMSO).

According to a further example the temperature, the current density, hence the bias voltage applied, the treatment time, the composition and concentration of the electrolyte are adjusted to obtain desired properties of the first reaction product. All these above-mentioned parameters may have an influence on the mechanical stability, in particular of the hardness of the first, second or third reaction products. Moreover, these parameters may have a respective influence on the geometric dimensions of the first portion and of the first reaction product entirely filling the first portion. The parameters also have an influence on the porosity and roughness as well as on the electrical insulating properties of the first or final reaction product.

With some examples and wherein the first material is a portion of the first level layer and comprises Molybdenum the electrochemical reaction may be divided into two subsequent steps. In a first step and by immersing the layer stack in a first electrically conductive solution, which may be a basic solution, Mo may quickly oxidize into $MoO_x$ with $2.5<x\leq3$. In a subsequent second step the layer stack is then immersed in a second solution, e.g. a pH neutral or acidic solution to further oxidize the Molybdenum into or towards a rather thick $MoO_3$ layer. In the second solution, the solubility of $MoO_3$ is substantially lower compared to the solubility of $MoO_3$ in the first solution. By applying the two-step process a comparatively thicker and mechanically more stable layer or layer portion of $MoO_3$, which is substantially electrically insulating, can be provided in the region of the first electrode layer.

According to another example the bias voltage is a DC voltage and/or an AC voltage. The bias voltage, i.e. the DC voltage, may be superimposed by an AC voltage. Moreover, with further examples a pulsed DC voltage may be applied in order to obtain a first reaction product with further improved insulating properties.

With other examples, in particular with the first portion of the layer stack coinciding with that portion of the first electrode layer that is uncovered by the first trench at least a portion of the uncovered first layer is entirely converted or transferred into the first or second reaction product along the thickness of the first electrode layer. The conversion or transformation of the first electrode layer across its entire thickness applies to at least 20% or to at least 50% of the width of the first trench. Typically, in a middle portion of the trench having equal distance to the oppositely located side edges of the trench the first electrode layer is completely converted into the first reaction product and/or second reaction product. In particular, the entire thickness of the first electrode layer, e.g. made of Molybdenum is converted or transformed into $MoO_3$ or into $MoO_x$ with $2.5<x\leq3$, at least along at least 20%, at least 30%, at least 40% or at least 50% of the width of the trench.

There is also self-stabilizing effect of the anodic oxidation process so that the electrochemical reaction and the conversion of the first portion into the first reaction product, i.e. the oxidation of the first material of first material composition into a respective oxide as the first reaction product is quite uniform. At the beginning of the electrochemical reaction, the Molybdenum on the bottom of a trench is oxidized comparatively fast. Depending on the transmission line resistance, the oxidation position close to the input contact oxidizes faster than the far positions because the potential is higher in the near position. However, after oxidizing the bottom of the trench, the reaction domain propagates further sidewards and beneath the photovoltaic layer. The diffusion of the reagent below the photovoltaic layer becomes the controlling process. The longer the diffusion distance will be, the lower will be the current density. So the resistance in the transmission line becomes a small part of the whole circuit voltage drop but the reagent diffusion from the edge of the scribe trench to the interface of intermediate reaction product and the final reaction product, hence $Mo/MoO_x$ becomes the predominant current limiting factor. This effect makes the oxidation uniform along the trenches.

According to another example the Molybdenum of the first or bottom electrode layer is converted electrochemically into an insoluble Molybdate. For this, and in particular after conducting the first process step of the electrochemical reaction, by way of which the Molybdenum layer has oxidized in the basic solution, the layer stack is merged or immersed into soluble Zn, Cd or Ca salt solution to further oxidize.

In order to keep the $MoO_3$ film on the surface is to convert it into insoluble Molybdate. A good candidate is $ZnMoO_4$ as Zn will not contaminate the film. $CdMoO_4$ could be another candidate. As the layer stack is submerged into soluble Zn or Cd salt solution it is further oxidized. Then the $MoO_3$ layer surface will be converted into insoluble Molybdate, therefore preventing the $MoO_3$ film from dissolving. In this further oxidation process, the pH of the solution should be well controlled because the CdS could be dissolved if the pH is too low. However, the Zn or Cd ions in the solution could form particles or gel if the pH is too high. Here, $CaMoO_4$ is also a good candidate because it may operate in basic solution or basic environment.

According to a further example the electrolyte solution is stirred or circulated while the layer stack is immersed or submerged in the electrolyte solution. This may help to reduce a concentration polarization effects. Typically, stirring or circulating of the electrolyte solution should take place initially, at least during the first process step, in which the layer stack is immersed in the basic electrolyte solution. There are numerous examples to achieve a stirring of the electrolyte solution. There could be applied an inlet and an outlet as well as a circulation pump in fluid communication with the inlet and the outlet of the container in which the electrolyte solution is contained. There could be further used a mixer or stirrer. Furthermore, an effective stirring of the electrolyte solution could be also achieved by ventilating the solution with a compressed gas, such as clean air. Here, the compressed air not only stirs the solution but also the oxygen dissolved in the solution works as a good oxidant. Towards the end of the electrochemical reaction the stirring may be stopped or abrogated for not dissolving the first reaction product.

According to a further example for patterning the photovoltaic layer structure a window layer is deposited onto the layer stack after the first portion of the layer stack has been transformed or converted into the first reaction product. Thereafter, the photovoltaic layer is selectively removed along a second line to form a second trench parallel to the first trench. The second line or second trench is adjacent to the first trench. Again, the second line exclusively removes a portion of the window layer and of the photovoltaic layer but leaves the entirety or at least a portion of the bottom electrode layer on the substrate.

Hence, the formation of the second trench does not have any substantial effect on the integrity of the first electrode layer and/or of the first reaction product of the first electrode layer.

According to a further example and after formation of the second trench a second electrode layer is deposited onto the layer stack and the photovoltaic layer is selectively removed along a third line to form a third trench parallel to the second trench and adjacent to the second trench. The second electrode layer may be also denoted or configured as a top electrode layer. Typically, the second trench is located between the third trench and the first trench. The first trench is at least partially filled with the window layer and with the material of the second electrode layer. The second trench is only filled or covered with the material of the top electrode layer. The third trench and hence formation of the third trench is limited to a removal of those layers that are located above the first electrode layer. Hence, during the scribing of the third line or third trench the first electrode layer remains substantially unaffected.

With numerous examples of the present method, wherein the first electrode layer has been transferred into the first reaction product in the region of the first trench, the second trench is scribed next to the first trench in such a way, that at least a portion of the original first electrode layer, hence of the first material of the bottom electrode layer and an adjacent portion of the electrochemically modified bottom electrode layer comprising the first reaction product are uncovered. In this way the second electrode layer deposited thereafter may get in electrical contact with the first electrode layer of a first solar cell as well as in electrical contact with the window layer of a second solar cell located adjacent to the first solar cell.

The second electrode layer is also in contact with the first reaction product located underneath the first trench. Accordingly, the second electrode layer of the second solar cell can be electrically insulated from the first or bottom electrode layer of the second solar cell.

By converting an originally electrically conductive portion of the first electrode layer into an insulating reaction product a rather effective means for patterning of a photovoltaic layer stack can be provided. Since the remaining gaps or trenches do not require to become filled with an insulating material the presently proposed method can be easily implemented in a mass manufacturing process. The patterned photovoltaic layer structures will exhibit a high quality and will be characterized by a long lifetime and durability as well as mechanical stability.

According to a further aspect the present invention also relates to a thin-film photovoltaic layer stack produced or patterned by a method as described above. The thin film photovoltaic layer stack comprises a substrate and a first electrode layer on the substrate. The layer stack further comprises a photovoltaic layer on the first electrode layer. Typically, the first electrode layer is directly or indirectly sandwiched between the substrate and the photovoltaic layer.

With some examples, there may be provided a further barrier layer between the substrate and the first electrode layer. The further barrier layer may counteract or effectively prevent diffusion of ions, e.g. of $Na^+$ from the substrate into the first electrode layer and/or into the photovoltaic layer.

At least one of the bottom electrode layer and the photovoltaic layer comprises a first reaction product obtained through an electrochemical reaction of a first material or first material composition of a first portion of the bottom electrode layer or photovoltaic layer. The first reaction product has an electrical conductivity that is lower than an electrical conductivity of the first material or of the first material composition.

Since the thin-film photovoltaic layer stack is produced by a method as described above all features, properties and aspects as described above in connection with the method of patterning a photovoltaic layer stack equally apply to the thin-film photovoltaic layer stack.

With another example there is provided a thin-film photovoltaic layer stack comprising a substrate, a first electrode layer on the substrate and a photovoltaic layer on the first electrode layer. The layer stack further comprises a first trench in the photovoltaic layer. Along the first trench there is provided a gap in the photovoltaic layer. Along or inside the first trench the first electrode layer is still present on the substrate. At least a portion of the first electrode layer underneath the first trench comprises a first reaction product obtained through an electrochemical reaction of the material of the first electrode layer.

With some examples, the bottom electrode layer comprises a metal and the first reaction product of the bottom electrode layer in the region of the first trench comprises one of a metal oxide, a metal selenide and a metal sulfide.

With further examples the bottom electrode layer comprises Molybdenum or is composed of Molybdenum. Then, the first reaction product located in the bottom electrode layer in the region of the first trench comprises $MoO_x$ with $2.5<x\leq3$. With some examples, at least 20% of the portion of the bottom electrode layer in the region or adjoining the first trench comprises $MoO_3$.

With some examples, at least a portion of the first electrode layer of the photovoltaic layer stack in the region of the first trench comprises a first reaction product having an electrical conductivity that is less than an electrical conductivity of the original material in this region. Hence, by conducting the electrochemical reaction process as described above the chemical composition of at least a portion of the bottom electrode layer has altered towards an electrical insulator. With some examples, the reaction product occupies the entire thickness of the first electrode layer as seen along a surface normal of the substrate. With some further examples, the portion of the reaction product occupying the entire thickness of the first electrode layer comprises a width in a direction perpendicular to the elongation of the first trench that is larger than 20%, larger than 30%, larger than 50%, larger than 75%, larger than 80%, larger than 90%, larger than 100% or even larger than 110% of the respective width of the trench.

With some examples, the width of the first portion of the bottom electrode layer underneath the first trench and perpendicular to the elongation of the trench is larger than 20%, larger than 30%, larger than 50%, larger than 75%, larger than 80%, larger than 90%, larger than 100% or even larger than 110% of the respective width of the trench. The larger the width of the first portion and hence the larger the width of the electrochemically modified portion of the bottom electrode layer is the larger will be the shunt resistivity of the respective photovoltaic layer stack when the top electrode layer is applied later on.

With other examples the thin-film photovoltaic layer structure comprises a first portion with a first reaction product in direct vicinity and in a region adjoining the first trench. With further examples, the thin-film photovoltaic layer stack comprises a first portion inside the layer stack formed by a reaction product of an impurity originally enclosed or embedded in the layer stack. The impurity, e.g. droplets of a metal or flakes, has been subject to an electrochemical reaction that leads to the formation of a first reaction product, wherein the first reaction product has an electrical conductivity that is lower than the electrical conductivity of the material of the impurity.

With some examples the photovoltaic layer stack comprises a first portion with a first material or first material composition that has been converted or transferred into a first reaction product as described above. This may for instance apply to a portion of the bottom electrode layer. The respective photovoltaic layer stack may further comprise a second portion of the layer stack that has been converted or transferred into a second reaction product by the electrochemical reaction as described above. Here, the second portion may apply to an edge region of the photovoltaic layer stack adjacent or adjoining the first trench.

As an alternative or in addition, the photovoltaic layer stack may also comprise a third portion inside or on the layer stack of a third material or third material composition that has been converted or transformed into a third reaction product, wherein the third reaction product exhibits an electrical conductivity that is lower than the electrical conductivity of the third material or third material composition. The third portion may apply to an impurity embedded or enclosed in the photovoltaic layer stack.

BRIEF DESCRIPTION OF THE DRAWING FIGURES

In the following, exemplary embodiments of the method and of a thin-film photovoltaic layer stack are described in greater detail by making reference to the accompanying drawing figures.

DETAILED DESCRIPTION OF EXEMPLARY EMBODIMENTS

Figure 1:
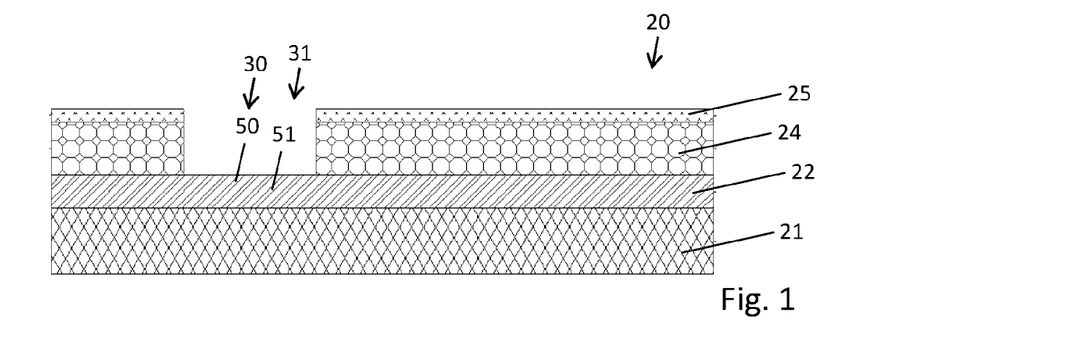
FIG. 1 schematically illustrates a photovoltaic layer stack after scribing of a first trench.

In FIG. 1 an exemplary embodiment of a thin-film photovoltaic layer stack 20 according to the present invention is illustrated. The layer stack 20 comprises a planar shaped substrate 21. On a top surface of the substrate 21 there is applied a bottom electrode layer 22. The bottom electrode layer 22 is continues over the entire substrate 21. The bottom electrode layer 22 typically comprises an electrically conducting metal, such as Molybdenum. On top of the bottom electrode layer 22 there is provided a photovoltaic layer 24 or semiconductor layer. The photovoltaic layer 24 may be also denoted as an absorber layer or photoelectric conversion layer. With some examples the photovoltaic layer 24 comprises a CIGS layer. Optionally and on top of the photovoltaic layer 24 there is provided a buffer layer 25.

There is further provided a first trench 31 extending along a straight first line 30. The first trench 31 forms a gap in the layer stack 20. The gap is only or exclusively present in the photovoltaic layer 24 and in the optional buffer layer 25. The scribing of the first trench 31 may leave the bottom electrode layer 22 substantially unaffected. For scribing of the first trench 31 there is typically used a laser beam moving along the first line 30.

Figure 8:
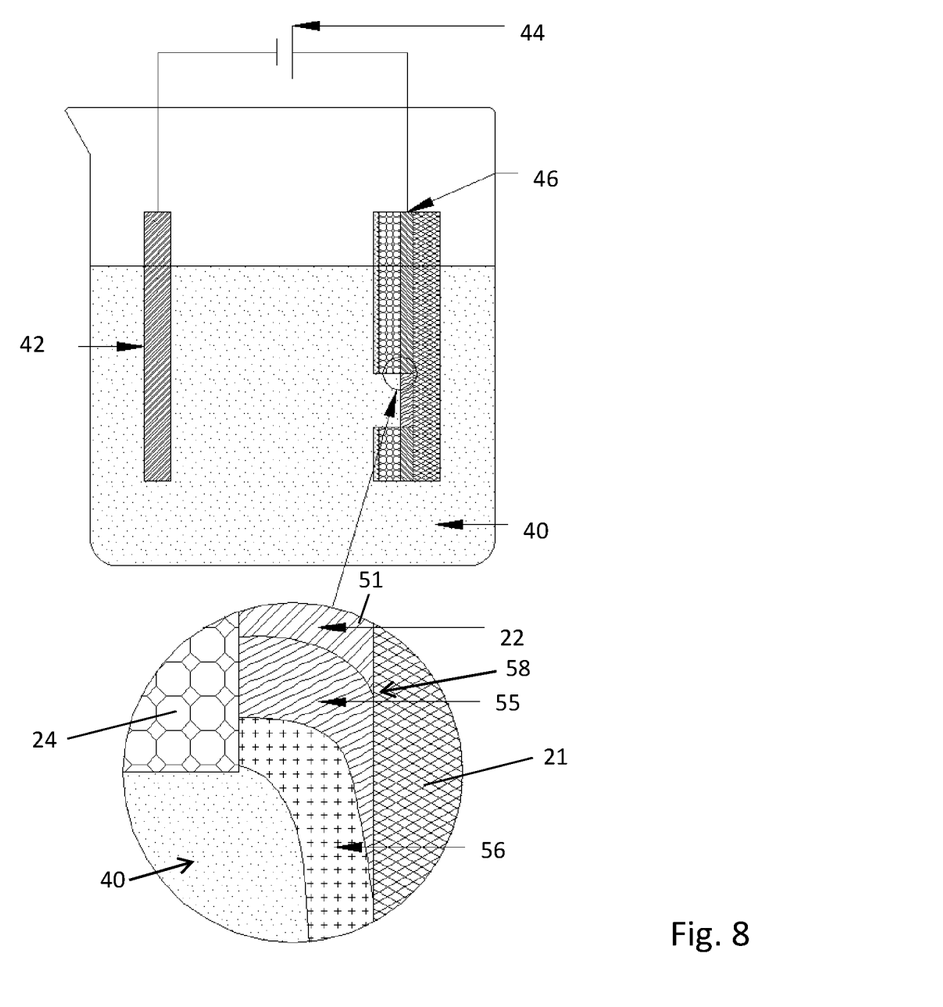
FIG. 8 schematically illustrates the immersion of the layer stack into an electrolyte solution and an enlarged section of the layer stack.

In the region of the first trench 31 there is provided a first portion 50 of the bottom electrode layer. The layer stack 20 as illustrated in FIG. 1 is immersed into an electrolyte solution 40 as illustrated in FIG. 8. Moreover, the bottom electrode layer 22 is connected to the anode of a DC voltage supply 44. There is further provided another electrode 42. The further electrode 42 is connected to the cathode of the DC voltage or current supply. Also, the second electrode 42 is immersed in the electrolyte solution 40. By immersing the layer stack 20 in the electrolyte solution 40 and by applying a DC voltage between the electrode 42 and the bottom electrode layer 22 an electrochemical reaction of the first portion 50 with the electrolyte solution 40 takes place. Hence, the material 51 or material composition located in the first portion 50 of the bottom electrode layer 22 is converted into at least a first reaction product 56. It may be further converted into a second or third reaction product depending on the specific electrochemical reaction process.

The first reaction product 56 obtained in the first portion 50 exhibits an electrical conductivity that is lower than the electrical conductivity of the first material 51 of the bottom electrode layer 22 in regions outside of and/or adjacent to the first portion 50. In this way, the first portion 50 may be entirely or at least partially converted or transferred into the first reaction product 56. The first portion 50 of the bottom electrode layer 22 may be then transformed or converted from an electrically conducting material into an electrically insulating material and/or into an electrically conducting material exhibiting a reduced electrical conductivity compared to the original material of the first portion 50.

Figure 3:
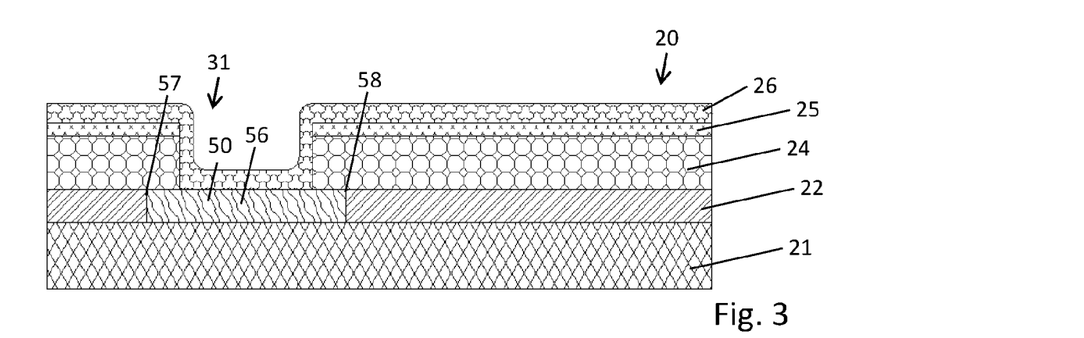
FIG. 3 shows the deposition of a window layer on the layer stack of FIG. 2.
Figure 4:
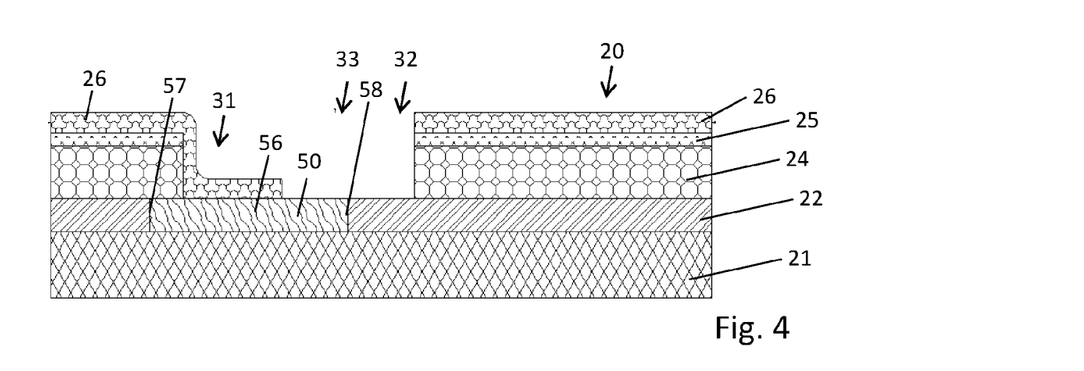
FIG. 4 shows the layer stack of FIG. 3 after scribing of a second trench.

In the process of patterning the thin-film photovoltaic layer stack 20 there is then applied an intrinsic window or window layer 26 on top of the layer stack 20 as illustrated in FIG. 3. The window layer 26 typically comprises intrinsic ZnO or i-ZnO. Thereafter and as illustrated in FIG. 4 a second trench 33 is scribed along a second line 32. In the region of the second trench 33 the layer stack 20 is at least partially removed. Removal of the layer stack particularly applies to the photovoltaic layer 24, to the optional buffer layer 25 and the window layer 26. Removal of the material may exclude removal of the bottom electrode layer 22 and the first portion 50 of the electrode layer that comprises the first reaction product 56.

Figure 2:
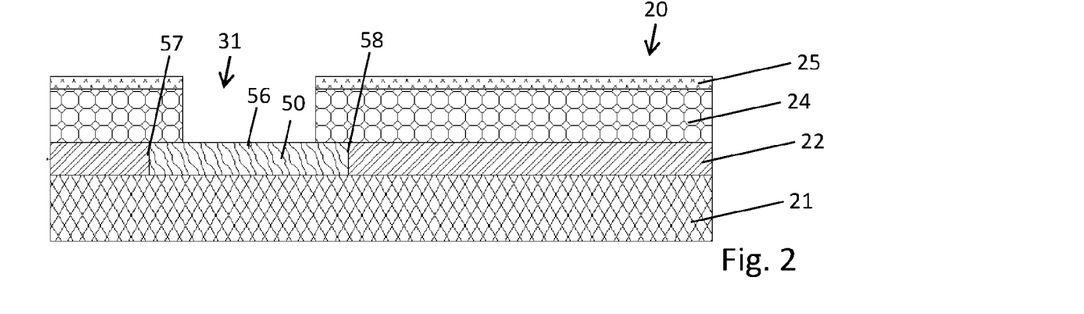
FIG. 2 shows the layer stack of FIG. 1 of the conversion of at least a first portion of the bottom electrode layer into a first reaction product.

In a direction perpendicular to the elongation of the first trench 31 or first line 30 the first portion 50 comprises a certain width. It extends from a first longitudinal edge 57 towards an opposite edge 58. The region of the bottom electrode layer 22 confined by the first and second edges 57, 58 defines the first portion 50 that is subject to the electrochemical reaction. As it is apparent from FIG. 2, the width between the first and second edges 57, 58 can be even larger than the corresponding width of the first trench 31.

As illustrated in FIG. 4, the second trench 33 is scribed across or over the second edge 58. In this way, the second trench 33 uncovers or reveals a portion of the original bottom electrode layer 22 at an adjacent part of the first portion 50 that has been converted into the first reaction product 56.

Figure 5:
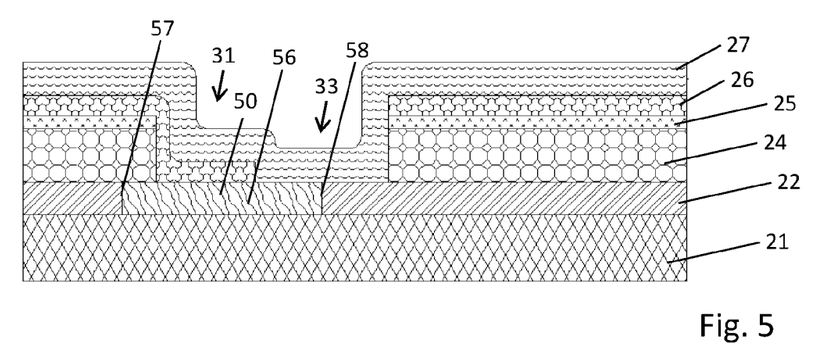
FIG. 5 shows the layer stack of FIG. 4 after deposition of the top electrode layer.

Thereafter and as illustrated in FIG. 5 a top electrode layer 27, e.g. in form of a transparent front electrode is deposited on the layer stack 20. The top electrode layer 27 may comprise at least one or a composition of the following materials: ZAO (zinc aluminum oxide or doped zinc aluminum oxide) and TCO (transparent conducting oxide).

Figure 6:
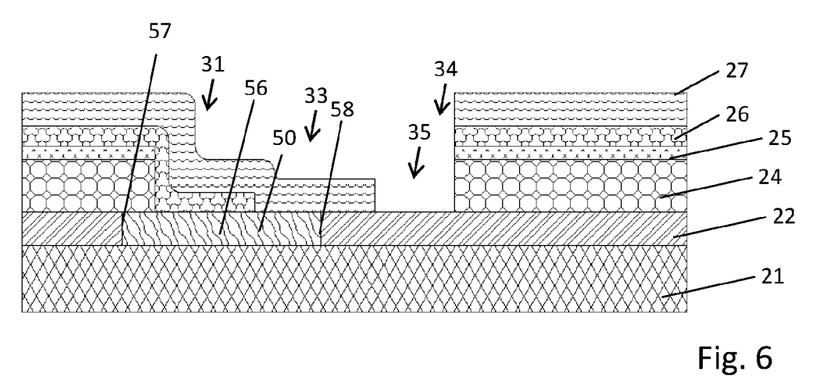
FIG. 6 shows the layer stack of FIG. 5 after scribing the third trench.

Thereafter and as illustrated in FIG. 6 a third trench 35 is scribed along a third line 34. The third trench 35 is scribed adjacent to the second trench 33. The third trench 35 forms a gap in the layer stack 20 above the bottom electrode layer 22. Here, the photovoltaic layer 24, the optional buffer layer 25, the window layer 26 and the top electrode layer 27 are removed while the bottom electrode layer 22 may remain on the substrate 21. In this way, a first solar cell 12 and a second solar cell 14 can be formed on the substrate 21. Of course, the entire substrate 21 is provided with a repetitive structure of first 31, second 33 and third 35 trenches to form a multitude of adjacently located solar cells 12, 14.

Figure 7:
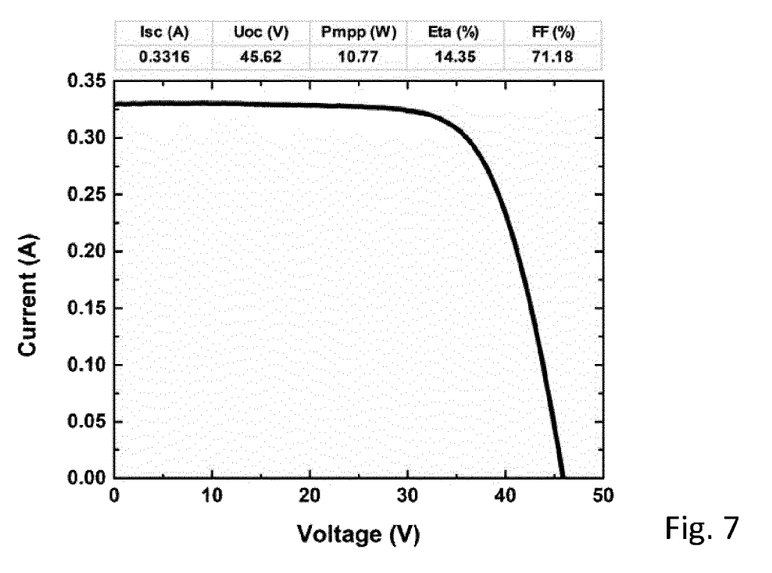
FIG. 7 shows a current/voltage diagram of a thin-film solar module produced in accordance with the method of the invention.

A bottom electrode layer portion 22 of the first solar cell 12 is electrically connected to the top electrode layer portion 27 of the second solar cell 14. The bottom electrode layer portion 22 of the second solar cell 14 is electrically insulated from the bottom electrode layer portion 22 of the first solar cell 12 by the reaction product 56 in the first portion 50 of the bottom electrode layer portion 22. In FIG. 7 a diagram of an applied current versus voltage for a 30 cm×30 cm module produced according to the present method. The module comprises 67 cells of 4 mm width and 280 mm length connected in serial. The diagram and hence the module shows high shunt resistance as we see from the current/voltage diagram.

In FIG. 8, the apparatus for conducting the electrochemical reaction is illustrated in greater detail. Typically, the electrolyte solution 40 comprises unionized water and numerous electrolytes. The pH and the concentration of the electrolyte can be controlled during the electrochemical reaction. As described above the bottom electrode layer 22 serves as an anode and a further electrode 42 serves as a cathode for the electrolytic conversion process. With some examples the DC voltage should be less than 3V so that the photovoltaic area will not be oxidized as the p-n junction built-in field blocks the current under low forward bias.

Nonetheless, the bottom electrode layer 22 is directly exposed to the electrolyte solution 40 and may quickly undergo the electrochemical reaction thereby converting or transforming the first portion 50 of the bottom electrode layer 22 into the first reaction product 56. The level of electrochemical reaction, e.g. the level of oxidation, selenization or sulfurization can be controlled by the following parameters: type of electrolyte, concentration of electrolyte, applied voltage, e.g. applied DC potential, and duration of the electrochemical reaction.

As illustrated in the enlarged portion of FIG. 8 there may evolve numerous reaction products in a sequential manner. Typically, the first portion 50 of the bottom electrode layer 22, hence a first material 51 thereof may be entirely converted into at least an intermediate product 55 before the intermediate product 55 is converted into the final reaction product, e.g. the first reaction product 56. From another perspective the intermediate product 55 may be also regarded as a first reaction product, which during the ongoing electrochemical reaction is converted or transformed further into a second reaction product 56.

With Molybdenum as a first material 51 of the bottom electrode layer 22 an intermediate product 55 may comprise $Mo_2O_5$, which is further converted into $MoO_3$ as the first reaction product 56. The electrochemical conversion of the initial material 51 of the bottom electrode layer 22 into the intermediate product 55 may be comparatively fast compared to the conversion of the intermediate product 55 into the first reaction product 56

By way of example, the metal electrode inside the first trench 31 will be oxidized rather quickly. The Molybdenum could be "over oxidized" to convert even the material under the absorber layer into Mo oxide as shown in the enlarged section of FIG. 8. In this way the latter applied front electrode layer, e.g. a TCO layer will not short to the bottom electrode layer 22. The cross section structure of the oxidation interface shows the oxidation processes. The Molybdenum quickly oxidizes into the intermediate reaction product 55 $Mo_2O_5$ in the Mo/$MoO_x$ interface. Then the intermediate product 55 $Mo_2O_5$ slowly oxidizes to $MoO_3$. During this second phase of oxidation, the concentration of oxygen increases inside the $MoO_x$ part until the oxide is well oxidized to $MoO_3$. Thick oxide layer impedes the transfer of reactants so the oxidation slows down. As a part of the $MoO_3$ may even dissolve into the solution, the oxidation may move forward.

The $MoO_x$ may comprise a combination of $MoO_2$, $Mo_2O_5$ and $MoO_3$. The higher the x value, the higher will be the resistivity. The resistivity can be controlled by the oxidation process. The over oxidation is to achieve high shunt resistance for solar cells and solar modules. When the width between the boundaries 57, 58 is at least about 10 μm or at least about 15 μm or at least about 20 μm larger than the width of the first trench 31 a high quality insulation can be obtained in principle.

Figure 9:
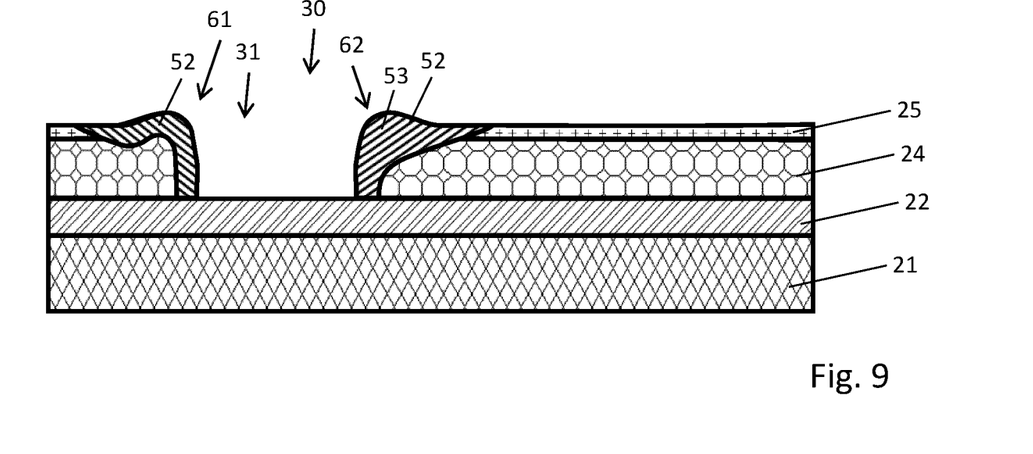
FIG. 9 schematically illustrates the formation and/or conversion of a portion of the layer stack adjoining the first trench.

In FIG. 9, another example of a thin-film photovoltaic layer stack 20 is illustrated, there, side edges 61, 62 of the photovoltaic layer 24 extending along the first trench 31 have been subject to a melting during the scribing of the first trench 31. Hence, these side edges 61, 62 can be equally regarded as a first portion 52 of the layer stack comprising a first material 53 or a first material composition that is convertible or transformable into a first reaction product 56 by the above-described electrochemical reaction. The first portion 52 of the layer stack 20 as illustrated in FIG. 9 may comprise $Cu_x(In,Ga)_y Se_z$, with $x+3y>2z$. In view of the above-described electrochemical reaction the respective first portions 52 of the layer stack 20 can be transferred or converted into a reaction product, such as, $Cu_x(In,Ga)_y Se_z O_w$, with $x+3y \leq 2(w+z)$ and $w>0$.

Here, the damaging of the semiconductor material of the photovoltaic layer 24 that is due to the scribing process of the first trench 31 can be at least partially compensated by e.g. an anodic oxidation process incorporating oxygen in the previously damaged semiconductor, thereby converting the damaged semiconductor material into a material composition exhibiting a lower conductivity compared to the damaged semiconductor material.

Figure 10:
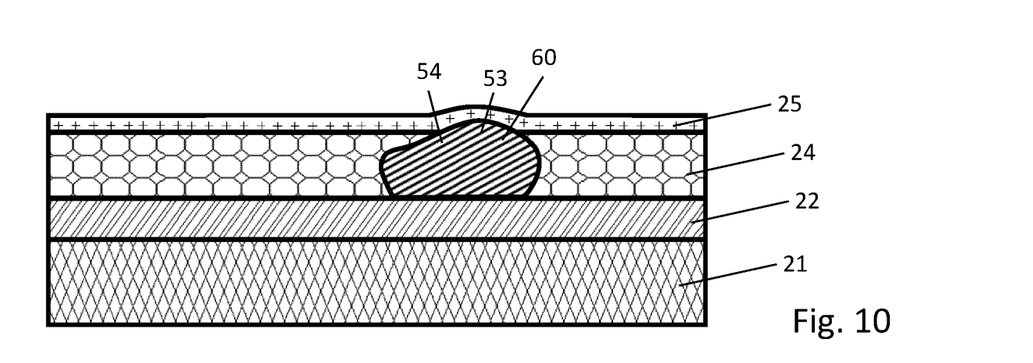
FIG. 10 is illustrative of an embodiment, wherein an impurity embedded in the layer stack is subject to an electrochemical conversion or transformation.
Figure 11:
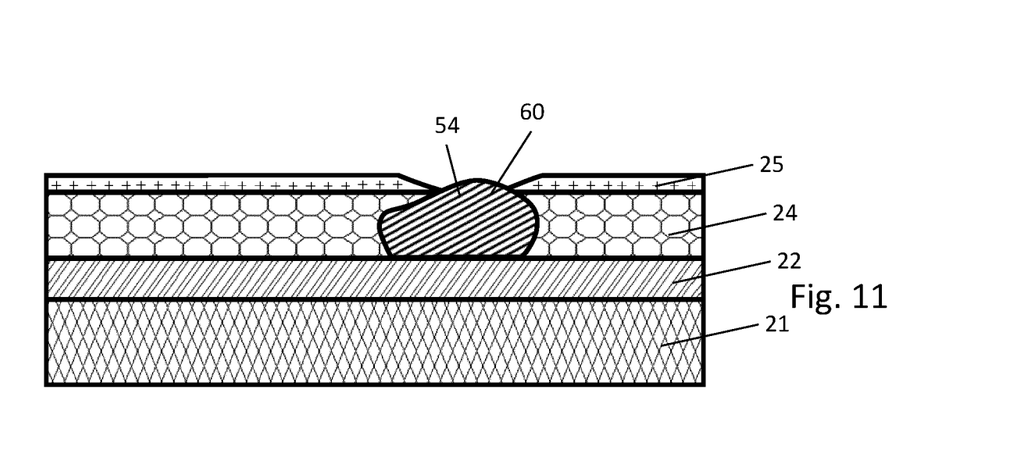
FIG. 11 is illustrative of another embodiment of an impurity inside the layer stack.

In the examples of FIGS. 10 and 11 it is even shown, that also an impurity 60 entirely or at least partially embedded in the thin-film layer stack 20 can become equally subject to the electrochemical reaction when immersed in the electrolyte solution 40 as described above in connection with FIG. 8. In the example of FIG. 10 the impurity 60 is covered by e.g. the buffer layer 25. The impurity 60 comprises the first material 53 or material composition. The buffer layer 25 may be permeable at least to a certain degree for the electrolyte solution so that the intended electrochemical reaction of the first material 53 may take place. Hence, the entirety or part of the first portion 54, hence of the impurity 60, spatially enclosing or coinciding with the first material 53, may take place in a similar way as described above.

Depending on whether the droplets are more indium or gallium rich or more copper rich, they are covered by the buffer layer 25 (FIG. 10) or the buffer layer deposition is locally suppressed (FIG. 11). It doesn't matter what the case is. In both cases the particle shunts the cell and in both cases the shunt can be removed by the anodic oxidation process. Typically the droplets are metallic and partially selenized during the absorber deposition process (composition with selenium deficiency). Their initial composition can be $Cu_x(In,Ga)_y Se_z$ with $x+3y>2z$. In both cases of FIGS. 10 and 11 the conducting impurity 60 can be converted by the anodic process into high resistive selenized/oxidized material. Their new composition is $Cu_x(In,Ga)_y Se_z O_w$, with $x+3y \leq 2(w+z)$ and $w>0$. This material is less conducting and does no longer behave like a shunt.

In FIG. 11, an example is illustrated, wherein the buffer layer 25 only partially covers the impurity 60. Here, the electrochemical reaction may take place at an increased rate.

Figure 12:
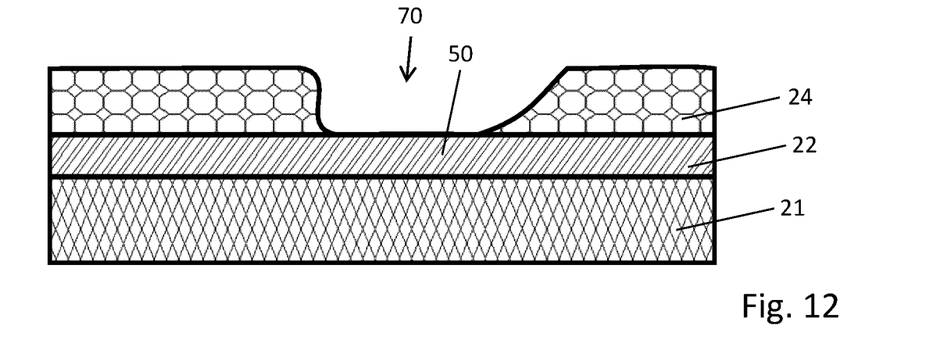
FIG. 12 shows another embodiment of a thin-film layer stack comprising a defect or a pinhole.
Figure 13:
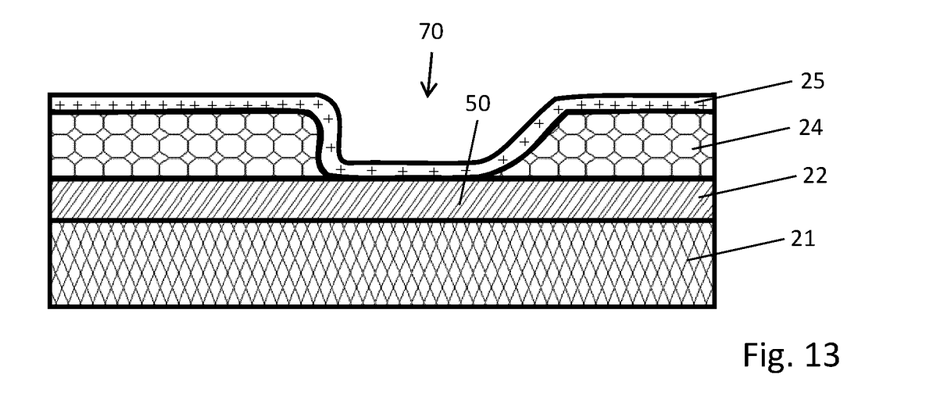
FIG. 13 illustrates the layer stack of FIG. 12 after deposition of the window layer on the photovoltaic layer.
Figure 14:
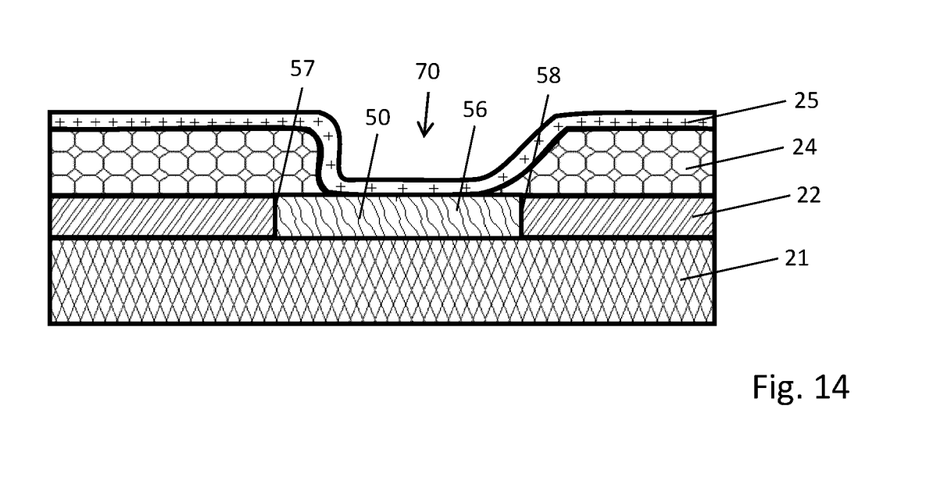
FIG. 14 shows the conversion of at least a portion of the bottom electrode layer through the electrochemical reaction even with the window layer deposited on top of the photovoltaic layer.

In the sequence of FIGS. 12-14 the negative impact of a pinhole in the photovoltaic layer 24 at its composition through the electrochemical reaction as described herein is described in greater detail. A pinhole 70, e.g. in form of a gap or recess in the photovoltaic layer 24 may be due to a perturbation in the deposition process. In practice such pinholes 70 may be due to the presence of dust particles on top of the bottom electrode layer 22. Even if such a pinhole 70 is overgrown or covered by the buffer layer 25 as illustrated in FIG. 13 it may lead to an electrical shunt between the bottom electrode layer 22 and the top electrode layer 27 that is applied later on.

During the above-described electrochemical reaction the portion 50 of the bottom electrode layer 22 located in direct vicinity or located underneath the area of the pinhole 70 can be subject to a conversion into the above-described reaction product 56 so that an eventual shunt between the bottom electrode 22 and the top electrode 27 is effectively avoided and prevented. Even though the buffer layer 25 may have a certain damping effect on the electrochemical reaction the electrochemical reaction with the electrolyte solution 40 can still take place because the buffer layer 25 is comparatively thin. It is hence permeable for the electrolyte solution 40 at least to a certain extent.

Figure 15:
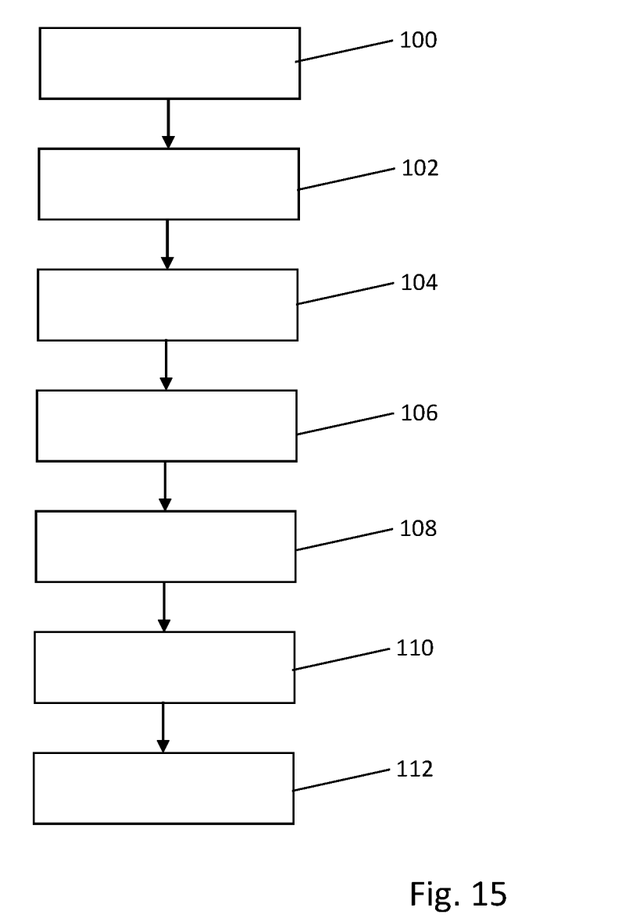
FIG. 15 is illustrative of a flowchart of conducting the method of patterning a thin-film photovoltaic layer stack.

In FIG. 15, a flowchart of the method of patterning the thin-film photovoltaic layer stack 20 is provided. In a first step 100 the layer stack 20 comprising a continuous bottom electrode layer 22 and at least a continuous photovoltaic layer 24 is provided. In a further step 102 the photovoltaic layer 24 is at least partially removed along a first line 30, thus forming a first trench 31. Thereafter, in step 104 the layer stack 20 is subject to the electrochemical reaction with the electrolyte solution 40 as described in connection with FIG. 8. Thereafter, in particular after termination of the electrochemical reaction the layer stack 20 is subject to the deposition of a window layer 26 in step 106. Application of such a window layer 26 is indicated in FIG. 3. Subsequently, in step 108 and as illustrated in FIG. 4, a second trench 33 is scribed along a second line 32. Thereafter, in step 110 the top electrode layer 27 is deposited on the layer stack 20 as illustrated in FIG. 5. Thereafter and in a final process step 112 a third trench line 35 is scribed along a third line 34 thus electrically connecting and shaping numerous solar cells 12, 14 on the substrate 21.

The invention claimed is:

1. A method of patterning a thin-film photovoltaic layer stack comprising:
    providing a continuous layer stack, the layer stack comprising a substrate, a first electrode layer on the substrate and a photovoltaic layer on the first electrode layer;
    immersing the layer stack into an electrically conductive solution;
    applying a bias voltage between the electrically conductive solution and the first electrode layer;
    selectively removing the photovoltaic layer along a first line and forming a first trench in the photovoltaic layer before or after immersing the layer stack into the electrically conductive solution; and
    converting a first material or a first material composition provided in at least a first portion of the layer stack into a first reaction product by an electrochemical reaction, wherein the first reaction product has an electrical conductivity that is lower than an electrical conductivity of the first material or the first material composition, wherein the first material or the first material composition of the first portion of the layer stack comprises Molybdenum (Mo), and wherein the first reaction product comprises $MoO_x$, with $2.5 < x \leq 3$.

2. The method according to claim 1, wherein selectively removing the photovoltaic layer and forming the first trench comprises:
    applying a laser beam onto the layer stack and moving the laser beam along the first line; or
    moving a mechanical scribing tool along the first line.

3. The method according to claim 1, wherein the first portion of the layer stack extends along the first trench.

4. The method according to claim 1, wherein the layer stack is immersed into a salt solution containing at least one of: Zn, Cd, or Ca, and wherein at least one of the first material, the first material composition, or the first reaction product is transformed into one of: $ZnMoO_4$, $CaMoO_4$, or $CdMoO_4$.

5. The method according to claim 1, wherein the first portion of the layer stack is a portion of the first electrode layer.

6. The method according to claim 1, wherein immersing the layer stack in the electrically conductive solution includes immersing the layer stack in a basic solution and thereafter immersing the layer stack in a neutral pH or acidic conductive solution.

7. The method according to claim 1, wherein a window layer is deposited onto the layer stack and wherein the photovoltaic layer is selectively removed along a second line to form a second trench parallel to the first trench and adjacent to the first trench.

8. The method according to claim 7, wherein a second electrode layer is deposited onto the layer stack and wherein the photovoltaic layer is selectively removed along a third line to form a third trench parallel to the second trench and adjacent to the second trench.

9. A method of patterning a thin-film photovoltaic layer stack comprising:
providing a continuous layer stack, the layer stack comprising a substrate, a first electrode layer on the substrate, and a photovoltaic layer on the first electrode layer;
immersing the layer stack into an electrically conductive solution;
applying a bias voltage between the electrically conductive solution and the first electrode layer;
selectively removing the photovoltaic layer along a first line and forming a first trench in the photovoltaic layer before or after immersing the layer stack into the electrically conductive solution; and
converting a first material or a first material composition provided in at least a first portion of the layer stack into a first reaction product by an electrochemical reaction,
wherein the first reaction product has an electrical conductivity that is lower than an electrical conductivity of the first material or the first material composition;
wherein the layer stack is immersed into a salt solution containing at least one of: Zn, Cd, or Ca; and
wherein at least one of the first material, the first material composition, or the first reaction product is transformed into one of: $ZnMoO_4$, $CaMoO_4$, or $CdMoO_4$.

10. The method according to claim 9, wherein selectively removing the photovoltaic layer and forming the first trench comprises:
applying a laser beam onto the layer stack and moving the laser beam along the first line; or
moving a mechanical scribing tool along the first line.

11. The method according to claim 9, wherein the first portion of the layer stack extends along the first trench.

12. The method according to claim 9, wherein the first material or the first material composition of the first portion of the layer stack comprises a metal, and wherein the first reaction product comprises one of: a metal oxide, a metal selenide, or a metal sulfide.

13. The method according to claim 9, wherein the first material or the first material composition of the first portion of the layer stack comprises Molybdenum (Mo), and wherein the first reaction product comprises $MoO_x$, with $2.5<x\leq3$.

14. The method according to claim 9, wherein the first portion of the layer stack is a portion of the first electrode layer.

15. The method according to claim 9, wherein immersing the layer stack in the electrically conductive solution includes immersing the layer stack in a basic solution and thereafter immersing the layer stack in a neutral pH or acidic conductive solution.

16. The method according to claim 9, wherein a window layer is deposited onto the layer stack, and wherein the photovoltaic layer is selectively removed along a second line to form a second trench parallel to the first trench and adjacent to the first trench.

17. The method according to claim 16, wherein a second electrode layer is deposited onto the layer stack, and wherein the photovoltaic layer is selectively removed along a third line to form a third trench parallel to the second trench and adjacent to the second trench.

18. A method of patterning a thin-film photovoltaic layer stack comprising:
providing a continuous layer stack, the layer stack comprising a substrate, a first electrode layer on the substrate, and a photovoltaic layer on the first electrode layer;
immersing the layer stack into an electrically conductive solution;
applying a bias voltage between the electrically conductive solution and the first electrode layer;
selectively removing the photovoltaic layer along a first line and forming a first trench in the photovoltaic layer before or after immersing the layer stack into the electrically conductive solution; and
converting a first material or a first material composition provided in at least a first portion of the layer stack into a first reaction product by an electrochemical reaction,
wherein the first reaction product has an electrical conductivity that is lower than an electrical conductivity of the first material or the first material composition;
wherein the first material or the first material composition of the first portion of the layer stack comprises a CIGS semiconductor material with a composition of $Cu_x(In,Ga)_y Se_z$, with $x+3y>2z$; and
wherein the first reaction product comprises a CIGS semiconductor material with a composition of $Cu_x(In,Ga)_y Se_z O_w$, with $x+3y\leq2(w+z)$ and $w>0$.

19. The method according to claim 18, wherein selectively removing the photovoltaic layer and forming the first trench comprises:
applying a laser beam onto the layer stack and moving the laser beam along the first line; or
moving a mechanical scribing tool along the first line.

20. The method according to claim 18, wherein the first portion of the layer stack is a side edge of the photovoltaic layer extending along the first trench.

21. The method according to claim 18, wherein immersing the layer stack in the electrically conductive solution includes immersing the layer stack in a basic solution and thereafter immersing the layer stack in a neutral pH or acidic conductive solution.

22. The method according to claim 18, wherein a window layer is deposited onto the layer stack, and wherein the photovoltaic layer is selectively removed along a second line to form a second trench parallel to the first trench and adjacent to the first trench.

23. The method according to claim 22, wherein a second electrode layer is deposited onto the layer stack, and wherein the photovoltaic layer is selectively removed along a third line to form a third trench parallel to the second trench and adjacent to the second trench.

* * * * *